United States Patent [19]

Owyang

[11] 4,345,266

[45] Aug. 17, 1982

[54] TRANSISTOR HAVING IMPROVED TURN-OFF TIME AND SECOND BREAKDOWN CHARACTERISTICS WITH BI-LEVEL EMITTER STRUCTURE

[75] Inventor: King Owyang, Baldwinsville, N.Y.

[73] Assignee: General Electric Company, Syracuse, N.Y.

[21] Appl. No.: 236,220

[22] Filed: Feb. 19, 1981

Related U.S. Application Data

[63] Continuation of Ser. No. 926,450, Jul. 20, 1978, abandoned.

[51] Int. Cl.³ .......................................... H01L 29/72
[52] U.S. Cl. ...................................... 357/34; 357/20; 357/36; 357/38
[58] Field of Search .................... 357/20, 34, 36, 38

[56] References Cited

U.S. PATENT DOCUMENTS 3,300,694  1/1967  Stehney et al. ................ 357/20

FOREIGN PATENT DOCUMENTS 1343419  1/1974  United Kingdom ............. 357/38

OTHER PUBLICATIONS

J. Gillett, "Power Transistor Having Increased Reverse Bias Safe Operating Area," IBM Tech. Discl. Bull., vol. 16 #11, Apr. 1974, p. 3642.

Primary Examiner—Joseph E. Clawson, Jr.
Attorney, Agent, or Firm—Robert J. Mooney

[57] ABSTRACT

A power transistor having improved turn-off characteristics and enhanced reversed second breakdown capabilities is described wherein the emitter of the transistor includes first and second regions, the first region being disposed within the second region and having lower gain than the second region. Turn off is enhanced as essentially no current flows under the lower gain first region during turn off thereby facilitating the removal of excess charge carriers when the device is in the turn-off stage.

1 Claim, 9 Drawing Figures

TRANSISTOR HAVING IMPROVED TURN-OFF TIME AND SECOND BREAKDOWN CHARACTERISTICS WITH BI-LEVEL EMITTER STRUCTURE

This is a continuation of application Ser. No. 926,450, filed July 20, 1978, now abandoned.

This invention relates in general to semiconductor devices and more particularly to three-element transistor semiconductor devices having faster turn-off time and higher reverse second breakdown characteristics than has been heretofore found. As power semiconductor devices become more and more widely employed in a variety of applications and, especially, in applications where high speed, small size, low weight, high efficiency, and the like, are demanded, the utmost in device performance is required. A particularly important characteristic in devices which are employed as solid state switches is that the speed of switching be as rapid as possible. This is due to the greatly increased power dissipation which is the result of low switching speed. Increased power dissipation results in poor device performance, the requirement for large heat sinks, and the use of larger and more expensive devices for the same application than would be required were higher switching speed provided to reduce power dissipation to a minimum.

In general, the greatest contribution to power dissipation in switching semiconductor devices is made during the turn-off rather than the turn-on period. This is due to the fact that, during turn off, device current typically remains at its quiescent value during at least a portion of the time that device voltage is increasing from a low saturation state value to a high blocking state value. During this period, substantial power may be dissipated by the device. It is advantageous, therefore, to provide a switching transistor in which the current through device begins to decrease rapidly as soon as possible after the application of a turn-off signal to the base. To this end, it has recently been the practice to provide an interdigitated structure for power semiconductor devices and particularly for transistor semiconductor devices which structure provides a longer base-emitter, turn-off line that is achievable with noninterdigitated structures, other considerations being the same. While the interdigitated structure provides many advantages over noninterdigitated devices, it is nevertheless not the ultimate attainable transistor device, at least with respect to switching speed. During turn off of the power transistor of the type including an interdigitated emitter including a spine portion for ready connection of a wire lead capable of sustaining the high current flow to the control by the device and a plurality of finger portions extending from the spine portion, which finger portions are interdigitated with like finger portions of the base of the device, turn off generally proceeds by first removing carriers from the edges of the fingers which are most closely proximate the base of the device followed by restriction of current flow to an area closer and closer to the center of the finger until ultimately complete turn off is achieved. It is inherent in this turn-off mechanism that as turn off proceeds and the current flow is increasingly restricted to the center portion of the emitter fingers, turn off becomes increasingly difficult. This is due to the fact that the current density becomes higher and the distance from the base of the device becomes greater. This results in both a time delay preceding the onset of current reduction during turn off, and, a reduction in the turn-off speed during the time when current is rapidly decreasing. The not-insubstantial increase in current density during the turn-off process not only increases the difficulty to turn off of the device and decreases the speed thereof but, in addition, produces yet another phenomenon, reverse second breakdown. As the current density increases, the electric field in the device becomes more and more dominated by the effect of mobile charge carriers rather than by background charge levels. As will be demonstrated below, the increase in mobile charge carriers during turn off results in greatly increased electric fields which in extreme cases cause the device to undergo reverse second breakdown.

It is an object of this invention to provide a semiconductor device having improved switching speed over prior art devices.

It is another object of this invention to provide a power transistor capable of controlling substantial amounts of current at high voltages which is not only faster than has been heretofore possible but which, also, exhibits improved reverse second breakdown characteristics.

It is still another object of this invention to provide an improved power transistor of the type discussed which is not substantially more expensive to manufacture than prior art devices.

Briefly stated and in accordance with a presently preferred embodiment of this invention, a new and improved, high-speed, switching transistor is provided having a collector region of a first conductivity type a base region of a second conductivity type opposite said first conductivity type and forming a first p-n junction with said collector region, and an emitter region interdigitated with said base region and including a plurality of relatively narrow finger portions extending from a relatively wide spine portion to which a high current capacity lead may be conveniently connected. The base layer, interposed between the emitter layer and the collector layer exhibits a first sheet resistance under most of the emitter layer and a second, lower, sheet resistance under certain portions of the emitter layer for promoting rapid turn off of those portions. In accordance with a specific preferred embodiment of this invention, the sheet resistance of the base layer underlying the center portion of each of the emitter fingers is selected to be relatively lower than the sheet resistance underlying the other portions of the fingers. In accordance with another preferred embodiment of this invention, the sheet resistance of the base layer underlying the relatively wider spine portion of the emitter region and especially the center of the spine portion is selected to be lower than the sheet resistance underlying the periphery of the spine portion of the emitter. In accordance with a presently preferred embodiment of this invention, this decrease in base-layer sheet resistance is provided by forming an emitter which has a first thickness, as measured from the surface of the device, in the area of the periphery of the emitter fingers and in the area of the periphery of the spine portion of the emitter layer, and a second, relatively shallower thickness in the center portion of the emitter fingers and of the spine portion of the emitter layer.

In accordance with an alternative embodiment of this invention, an emitter electrode is provided which is spaced from the emitter layer of the device as, for example, by an intermediate oxide layer, essentially only in the center portion of the emitter finger and in the center portion of the spine region of the emitter layer. In this way, self-debiasing occurs in the emitter underlying said spaced portions of the emitter electrodes, reducing the gain of the device in these areas and consequently reducing current crowding.

In accordance with each of these embodiments of this invention, high current densities heretofore associated with the restriction of current during turn off to the center portion of the interdigitated emitter fingers is alleviated; the electric fields associated therewith are reduced substantially and reverse, second breakdown characteristics of the device are enhanced.

The features of the invention which are believed to be novel are pointed out with particularity in the appended claims. The invention itself, however, both as to its organization and method of operation together with further objects and advantages thereof may best be understood by reference to the following description taken in connection with the accompanying drawings in which:

Figure 1:
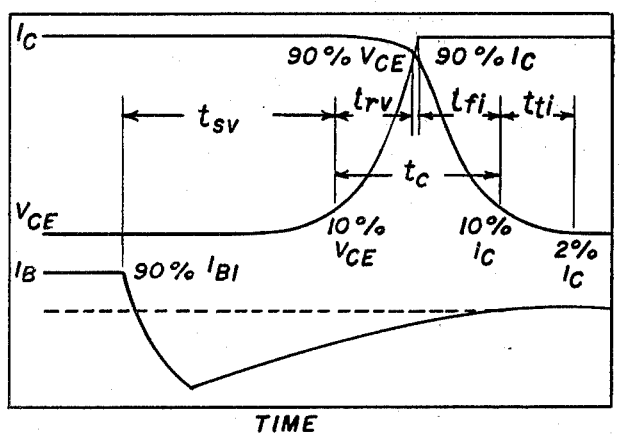
FIG. 1 is a graphical representation of the current and voltage signals of a transistor during turn off.

FIG. 1 is a graphical representation of the collector current, collector-emitter voltage and base current in a transistor of the type to which this invention relates, during the turn-off portion of a device switching cycle, an inductive load being presumed. Each of the turn-off parameters is separately plotted on the same time scale so that the interrelationship between the base drive signal and the collector current and voltage may be readily observed. The wave forms of FIG. 1 are understood to be exemplary, but are, in fact, typical of the wave forms which might be observed in switching circuits as would be expected to be found in inverter circuits. Several portions of the turn-off current wave form are of interest. Between the onset of the fall of base current and the beginning of the change in collector current and voltage, a time delay is observed which is conventionally designated $t_{SV}$. During this period, relatively little power is dissipated in the device since, although the collector current remains high, the collector-emitter voltage remains low. After this time, the collector-emitter voltage, $V_{CE}$, starts to rise at a rapid rate while the collector current, $I_C$, remains above about 90% of its quiescent value. This period of relatively high $I_C$ and rising $V_{CE}$ is referred to as $t_{rv}$. During this period, substantial amounts of power must be dissipated by the device. Immediately after $t_{rv}$ has elapsed, $I_C$ and $V_{CE}$ are both near their maximum values and during this period the maximum amount of power dissipation occurs. Shortly after the collector-emitter voltage has reached its blocking level, $I_C$ begins to fall rapidly during the period designated $t_{fi}$. During this time, substantial amounts of power, although less than during the time when $I_C$ and $V_{CE}$ are both high, are dissipated. The overall period from the time value when $V_{CE}$ increases to about 10% of its maximum value and the time when $I_C$ decreases to 10% of its maximum value is designated $t_C$ and is a time period during which substantially all of the power dissipation which occurs during turn off occurs. This time period may be as long as several microseconds even in switching transistors such as interdigitated switching transistors which are designed for high speed.

Figure 2:
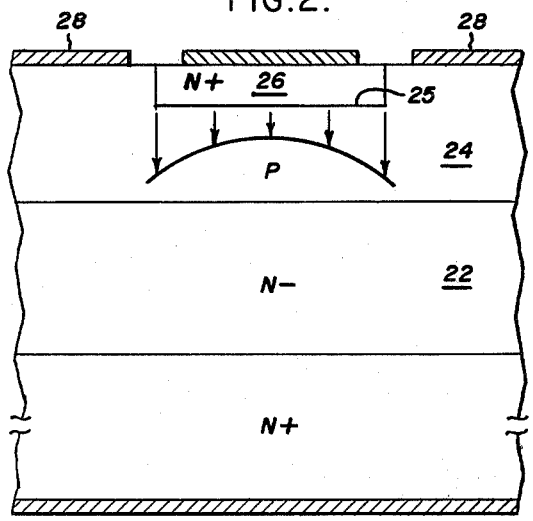
FIG. 2 is a cross sectional view of a portion of a transistor in accordance with the prior art.

FIG. 2 is a cross section view of a conventional interdigitated switching transistor 20 in accordance with the prior art. The section of FIG. 2 is taken through an emitter finger 26 and shows the current densities under that finger during turn on. As the device turns on, the effect of the base current signal in debiasing the base emitter junction 25 is most pronounced near the center edges of the emitter fingers closest to the base electrode. This causes a non-uniform current distribution under the emitter finger with relatively larger current flowing near the edges and less current in the center portion of the fingers. As the device turns on, charge is stored both in the base 24 and collector 22 regions of the device. The greater the magnitude of the base drive signal, the more stored charges accumulate, especially, in the collector region.

Figure 3:
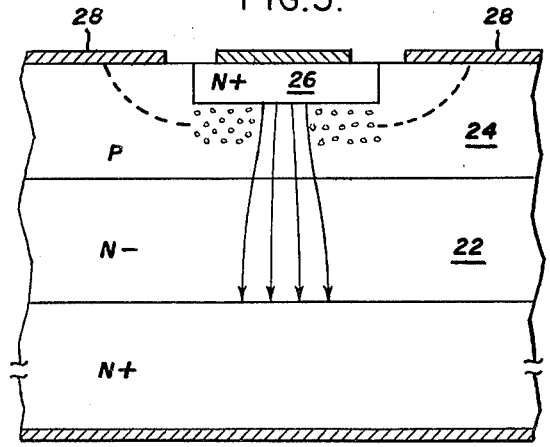
FIG. 3 is a view similar to that of FIG. 2 including a schematic representation of the turn-off process.

FIG. 3 is a cross-section view of the same structure as illustrated in FIG. 2 showing the turn-off mechanism in a transistor of the type to which this invention is addressed. Like elements of FIGS. 3 and 2 are designated with like reference numerals. During turn off, minority carriers under emitter 26 are first swept from beneath the edges of the emitter closest to base electrodes 28 by the application of a turn-off current signal to base electrodes 28. As the device ceases to conduct under the outer edges of emitter 26, the current density underlying the center of emitter 26, where stored charge is the most difficult to remove, increases as the emitter starts to inject more heavily in the center region, thus making up for the injection which has ceased to occur at the emitter edges. In addition, the base turn-off signal tends to debias the edges of the formerly forward-biased base emitter junction, thus further causing restriction of current flow to the center portion of the emitter.

Figure 4:
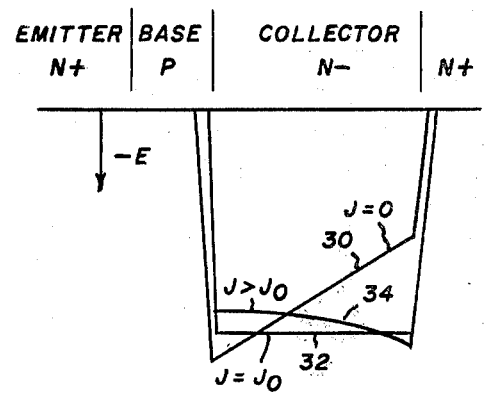
FIG. 4 is a graphical representation of the electric fields in transistors for various current densities.

As the collector current is restricted or pinched toward the center region of the emitter, the current density increases dramatically insofar as the collector current remains relatively constant during the initial phases of turn off. This increase in current density manifests itself in two phenomena: the increasing difficulty in achieving complete turn off, and, in extreme cases, reverse second breakdown. Reverse second breakdown may be readily understood by referring now to FIG. 4 wherein the electric field profile for the collector region and the two junctions adjacent the collector region of a transistor of the type illustrated in FIG. 3 are shown. The magnitude of the electric field may be obtained from the relationship of $$\frac{dE}{dx} = \frac{q}{\epsilon}\left[N_c - \frac{J_{max}}{qV_1}\right]$$

wherein the magnitude of the electric field is seen to increase rapidly as the current density, $J_{max}$, increases while the background charge level, $N_C$, remains constant. FIG. 4 illustrates the electric field profiles in a collector for three values of collector current: curve 30 where the current density equals zero, corresponding to the cutoff state; curve 32 where the current equals the quiescent on state collector current; and the curve 34 where the current density is greater than the steady state value, $J_0$, and wherein the increase in electric fields at the n−-n+ *junction is readily observed.*

It is a feature of this invention that not only is turn off facilitated by the improved emitter design but, in addition, reverse second breakdown is substantially eliminated.

Figure 5:
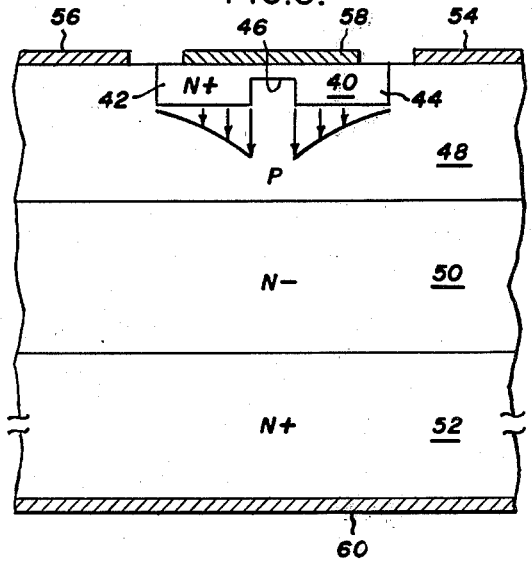
FIG. 5 is a cross sectional view of a portion of a transistor according to this invention.

Referring now to FIG. 5, a cross sectional view similar to that of FIGS. 2 and 2 is shown including an emitter according to the instant invention. Emitter finger 40 includes relatively thicker portions 42 and 44 which surround relatively thinner portion 46. The thicknesses of base layer 48, collector layer 50, and collector contact layer 52 are relatively unchanged with respect to the corresponding layers in FIGS. 2 and 3. FIG. 5 indicates, by arrows, the current distribution during the initial phase of turn off as current flows from base electrodes 54 and 56 which are understood to be connected in the conventional manner for an interdigitated switching transistor. For completeness, emitter electrode 58 and collector electrode 60 are also shown. As has been hereinabove described, the current during turn off is squeezed towards the center of emitter 40. The relatively shallower portion 46 of emitter 40 has lower injection efficiency and lower transport factor, resulting in lower gain, and therefore during turn off, essentially no current flows in that region as the current density is zero or quite low. Therefore, whereas in the prior art transistor, injection increased towards the center of the device as current was squeezed during turn off, in accordance with this invention, the current density in the center of the emitter is low.

It is preferred that the thickness of region 46 be as low as possible. Where the emitter is formed by diffusion in two steps, it is recognized that arbitrarily thin regions are difficult to form and may lead to shorting where the diffusion is not completely uniform. It has been found that where the nominal emitter diffusion depth is to 10 to 20 microns a depth in region 46 of one to two microns provides satisfactory results.

It will be recognized that providing a relatively thinner emitter inner portion 46 is but one way of achieving the decreased injection efficiency which limits the amount of current flow under the emitter of a transistor in accordance with this invention. Other methods which reduce the base sheet resistance in the center portion of the emitter are equally effectual to provide the desired function.

Figure 6:
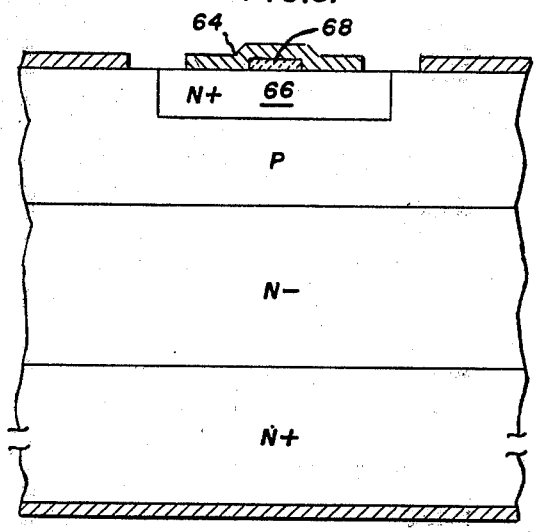
FIG. 6 is a cross section view of a portion of a transistor according to another embodiment of this invention.

Referring now to FIG. 6, an alternate embodiment of this invention is illustrated wherein emitter electrode 64 is spaced from emitter 66 by oxide layer 68 in the center portion of the emitter. In this way, an emitter may be formed without the necessity for a two-step diffusion or similar process insofar as the emitter itself is of uniform thickness, the decrease in injection efficiency being achieved by physically spacing the electrode from the emitter and electrically isolating it at least in the center portion of the emitter. In all other respects, the structure of FIG. 6 is identical to that of FIG. 5.

Figure 7:
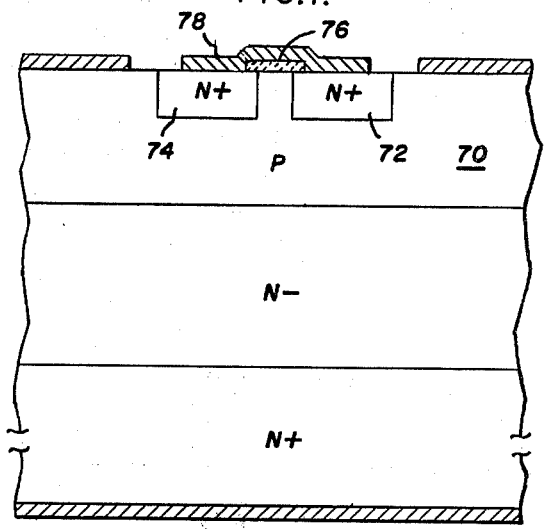
FIG. 7 is a cross section view of a portion of a transistor according to another embodiment of this invention.

Referring now to FIG. 7, still another alternative embodiment of this invention is illustrated wherein the inner portion of emitter 74 is of zero thickness, base layer 70 terminating at surface 72. The device of FIG. 7 represents the limiting case of the embodiment of this invention illustrated at FIG. 5 and requires the addition of oxide layer 76 to prevent shorting of the base emitter junction by electrode 78. It will be appreciated that although emitter layer 74 appears in the section view of FIG. 7 as two discrete regions the two outer portions of the emitter are connected not only by electrode 78 but are joined at the spine portion of the comb-shaped emitter structure as well as at the ends of the individual fingers. The base layer sheet resistance under the center portion of emitter 74 will be appreciated to be much less than under the edge portion of the emitter and further it will be readily observed that the injection efficiency in the center portion where the emitter layer is completely absent will be essentially zero. Therefore, no current will flow in this center portion either during turn on or turn off.

Figure 8:
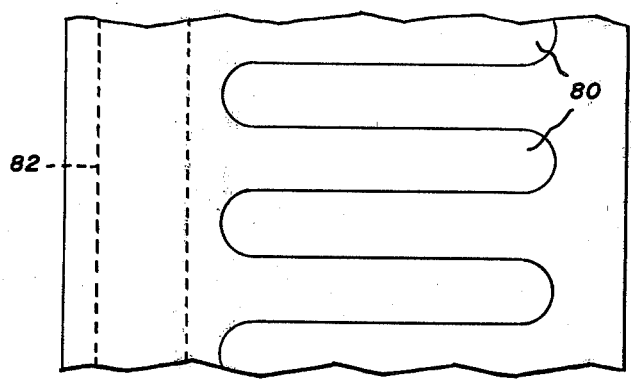
FIGS. 8 and 9 are top views of a portion of a transistor in accordance with two embodiments of this invention.
Figure 9:
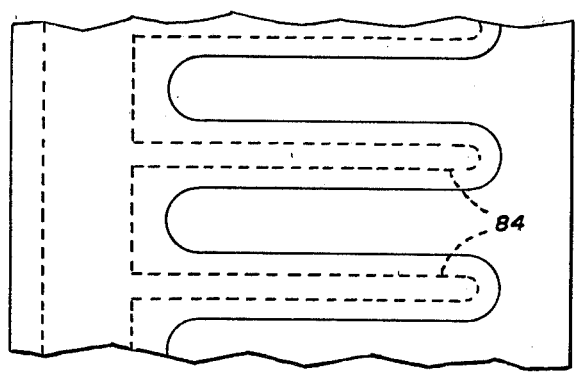

FIG. 8 is a top view of a portion of a transistor in accordance with this invention wherein the emitter 80 includes a region 82 of relatively lower injection efficiency essentially only under the spine portion of the comb-shaped emitter structure. It is under this relatively wide spine portion (with respect to the emitter fingers) that turn off is most difficult and that, therefore, is primarily responsible for poor turn-off speed characteristics. It has been found, however, that with the further addition of regions 84 under the finger portions of the emitter as illustrated in FIG. 9, even further improvement in switching speed and, therefore, in device dissipation may be obtained.

The improvements achieved by the new emitter structure of this invention are substantial. In a controlled device, the fall time, $t_f$, was found to be as long as 0.4 $\mu$/sec., while in a device having the emitter structure of this invention, the fall time of the collector current was on the order of 0.1 $\mu$/sec. The improvement in storage time, $t_{si}$, is likewise improved with the new emitter structure. During the storage time, carrier removal is, at least in part, aided by minority carrier recombination. During the period when current is falling, the rate of minority carrier removal is almost entirely dependent upon base current and is therefore greatly improved in accordance with the new structure.

By far, the most important measure of device performance is power dissipation during switching. A readily observed parameter indicative of switching loss is the change in temperature of the device during switching. Devices in accordance with the emitter construction of this invention have been found to exhibit improvements in power dissipation of at least three times over prior art devices and improvements in reverse bias safe operating areas in excess of 10%. The following table compares the characteristics of a prior art control device and a device according to the instant invention.

| Device | $H_{fe}$ 1A/5V | $H_{fe}$ 5A/5V | $H_{fe}$ 10A/5V | $t_s$ 10A/±2A | $t_f$ 250V | T (°C.) | B $V_{CEO}$ @ 10ma (Volts) |
|---|---|---|---|---|---|---|---|
| Control | 35 | 28 | 15.8 | 2.9 | .4 | 91° rising | 551 |

-continued

| Device | H$_{fe}$ 1A/5V | H$_{fe}$ 5A/5V | H$_{fe}$ 10A/SV | t$_s$ 10A/±2A | t$_f$ 250V | T (°C.) | B V$_{CEO}$ @ 10ma (Volts) |
|---|---|---|---|---|---|---|---|
| New Emitter Structure | 29 | 25 | 15 | 2.2 | .1 | 33° | 578 |

While this invention has been described in accordance with several preferred embodiments thereof, it will be appreciated by those skilled in the art that many modifications and changes may be made herein without deviating from the true spirit and scope of the invention. For example, while several methods for forming a two-level emitter has been described wherein diffusion is employed, it will be appreciated that other methods are applicable. For example, the thicker portions of the emitter may be formed by diffusion while the center portions are formed by ion implantation or the like. Accordingly, it is intended that the scope of the invention be limited only by the appended claims.

What is claimed is:

1. In a semiconductor switching transistor constituted by a semiconductor body having a major face inset into which is a comb-shaped emitter region including a longitudinal spine portion from which laterally extends a plurality of finger portions arranged for interdigitation with a base region, said emitter region being arranged to define with the base region a PN junction terminating in said major face, the improvement for increasing switching speed comprising said emitter spine portion and emitter finger portions having edge portions connected to form a continuous peripheral portion extending from said major face into said semiconductor body to a termination at said PN junction at a first depth below said major face, said emitter spine portion and emitter finger portions further having a common interior portion bordered by said peripheral portion and extending from said major face into said semiconductor body to a termination with said PN junction at a second depth below said major face less than said first depth, and an emitter electrode directly contacting said major face over the entirety of said interior portion and part of said peripheral portion.

* * * * *